(12) United States Patent
Shimokoshi

(10) Patent No.: US 8,542,711 B2
(45) Date of Patent: Sep. 24, 2013

(54) FIBER LASER DEVICE

(71) Applicant: Fujikura Ltd., Tokyo (JP)

(72) Inventor: Kotaro Shimokoshi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/628,836

(22) Filed: Sep. 27, 2012

(65) Prior Publication Data

US 2013/0022061 A1  Jan. 24, 2013

Related U.S. Application Data

(63) Continuation of application No. PCT/JP2011/057850, filed on Mar. 29, 2011.

(30) Foreign Application Priority Data

Mar. 31, 2010  (JP) ................................. 2010-084168

(51) Int. Cl.
    *H01S 3/30* (2006.01)
(52) U.S. Cl.
    USPC ..................... 372/6; 372/29.012; 372/29.015; 372/29.011; 372/38.01; 372/38.02; 372/38.04; 372/38.07; 372/38.06; 372/70
(58) Field of Classification Search
    USPC ............. 372/6, 29.012, 29.015, 38.02, 38.06, 372/38.07, 29.011, 38.01, 38.04, 70
    See application file for complete search history.

(56) References Cited

U.S. PATENT DOCUMENTS

| | | | |
|---|---|---|---|
| 6,370,175 B1 | 4/2002 | Ikeda et al. | |
| 6,711,187 B2 * | 3/2004 | Tanner et al. | .................. 372/30 |
| 7,433,375 B2 * | 10/2008 | Wu et al. | .................. 372/29.021 |
| 8,050,302 B2 * | 11/2011 | Furuya et al. | ................... 372/34 |
| 2002/0190666 A1 | 12/2002 | Sakamoto et al. | |
| 2005/0018723 A1 * | 1/2005 | Morita et al. | ............... 372/29.02 |
| 2011/0051764 A1 * | 3/2011 | Kamatani | .................. 372/38.04 |

(Continued)

FOREIGN PATENT DOCUMENTS

| | | |
|---|---|---|
| JP | 06-275895 A | 9/1994 |
| JP | 09-058048 A | 3/1997 |

(Continued)

OTHER PUBLICATIONS

International Search Report of PCT/JP2011/057850 dated May 10, 2011.

(Continued)

*Primary Examiner* — Jessica T Stultz
*Assistant Examiner* — Delma R Forde
(74) *Attorney, Agent, or Firm* — Sughrue Mion, PLLC

(57) ABSTRACT

A laser diode driving device (1) of the present invention includes: a variable DC power supply (3) for outputting a voltage for driving laser diodes (LD1 to LDn); a current driving element (4) for causing a current If to flow; a current control section (5) for controlling (i) turning on and off of the current driving element (4) and (ii) the amount of the current If; and a power supply control section (7) for controlling an output voltage of the variable DC power supply (3). The power supply control section (7) controls, on the basis of If-Vf characteristic data (D2), voltage drop characteristic data (D3), and Vds setting data (D4) all stored in a memory section (8), the output voltage of the variable DC power supply (3) so that the current driving element (4) has a constant inter-terminal voltage regardless of the amount of the current If.

12 Claims, 9 Drawing Sheets

(56) References Cited

U.S. PATENT DOCUMENTS

| | | | |
|---|---|---|---|
| 2011/0164649 A1* | 7/2011 | Xuan et al. | 372/75 |
| 2012/0263198 A1* | 10/2012 | Oba et al. | 372/6 |
| 2012/0280970 A1* | 11/2012 | Kato et al. | 345/212 |
| 2013/0088911 A1* | 4/2013 | Nakura et al. | 365/148 |

FOREIGN PATENT DOCUMENTS

| | | |
|---|---|---|
| JP | 11-291548 A | 10/1999 |
| JP | 2003-008138 A | 1/2003 |
| JP | 2003-347663 A | 12/2003 |
| JP | 2006-210835 A | 8/2006 |
| JP | 2009-278144 A | 11/2009 |
| WO | 2004/057924 A1 | 7/2004 |

OTHER PUBLICATIONS

Office Action issued by Japanese Patent Office in Japanese Patent Application No. 2010-084168 dated Jul. 16, 2013.

* cited by examiner

FIBER LASER DEVICE

CROSS-REFERENCES TO RELATED APPLICATIONS

This application is a Continuation of PCT International Application No. PCT/JP2011/057850 filed in Japan on Mar. 29, 2011, which claims the benefit of Patent Application No. 2010-084168 filed in Japan on Mar. 31, 2010, the entire contents of which are hereby incorporated by reference.

TECHNICAL FIELD

The present invention relates to (i) a light source driving device for driving a semiconductor light source such as an excitation laser diode and (ii) a fiber laser device including the light source driving device.

BACKGROUND ART

A fiber laser device has been widely used in such applications as inscription of a character on a metal plate and microfabrication of metal. A fiber laser device includes (i) an amplification fiber having a core to which rare earth has been added and (ii) a laser diode for emitting excitation light. A fiber laser device outputs laser light by exciting the amplification fiber with excitation light.

A fiber laser device includes a laser diode driving device for driving the laser diode. Patent Literatures 1 to 3 each disclose a light source driving device for driving a semiconductor light source such as a laser diode and a light-emitting diode.

Patent Literature 1 discloses a light-emitting diode driving device that is capable of causing a constant current to flow through a plurality of light-emitting diodes regardless of whether the output voltage of a direct-current power supply used is higher or lower than the total of respective forward voltages of the light-emitting diodes. Patent Literature 1 further takes into consideration such aspects as a temperature-dependent change in the forward voltages and variation among the respective forward voltages of the individual light-emitting diodes. Patent Literature 2 discloses a light-emitting diode driving device that carries out feedback control from the output side in order to adjust respective amounts of electric power to be supplied to a plurality of light-emitting diodes.

Further, there has been developed a fiber laser device that is capable of automatically controlling turning on and off of laser light output in correspondence with a processing order. Such a fiber laser device is capable of not only an operation that keeps steadily outputted laser light ON, but also an operation that turns laser light ON and OFF in a certain cycle (several hundreds of microseconds or longer). The fiber laser device is further capable of changing its laser light output for each period during which the light output is ON.

FIG. 8 is a block diagram schematically illustrating a configuration of a laser diode driving device 101 included in a conventional fiber laser device. The laser diode driving device 101 is a device for driving n laser diodes LD1 to LDn connected to one another in series, and includes a DC power supply 102, a current driving element 103, a current control section 104, and a fiber laser control section 105.

The DC power supply 102 is a constant voltage source, and outputs a voltage Vcc for driving the laser diodes LD1 to LDn. The current driving element 103 includes, for example, an N-channel type MOS transistor, and causes a current If to flow through the laser diodes LD1 to LDn.

The fiber laser control section 105 supplies, on the basis of a preset sequence program, the current control section 104 with a sequence control signal indicative of a light output P and output continuing period t for the laser diodes LD1 to LDn. The current control section 104 outputs, on the basis of the sequence control signal, a current control signal to the gate terminal of the current driving element 103 to control (i) turning ON and OFF of the current driving element 103 and (ii) the amount of the current If.

FIG. 8 shows Rall, which indicates resistance in the circuit constituted by the DC power supply 102, the current driving element 103, and the laser diodes LD1 to LDn which resistance is of wiring and the like excluding the current driving element 103 and the laser diodes LD1 to LDn.

(a) through (g) of FIG. 9 illustrate respective waveforms of, for example, (i) a voltage control signal from the current control section 104 and (ii) a current If through the laser diodes LD1 to LDn for the case in which the laser diodes LD1 to LDn output a light output P1 during an ON period T1 and output a light output P2 (P1<P2) during an ON period T2.

(a) of FIG. 9 illustrates a waveform of the current control signal outputted by the current control section 104 (that is, the gate voltage Vg of the current driving element 103). Since the fiber laser device has a light output that is proportional to the value of a current through the laser diodes LD1 to LDn, the current control signal has a voltage that is higher during the ON period T2 than during the ON period T1.

(b) of FIG. 9 illustrates a waveform of the current If through the laser diodes LD1 to LDn. Since a voltage Vg2 applied to the gate terminal during the ON period T2 is higher than a voltage Vg1 applied to the gate terminal during the ON period T1, a current If2 during the ON period T2 is larger than a current If1 during the ON period T1. Thus, as illustrated in (c) of FIG. 9, a forward voltage Vf2a of the laser diodes LD1 to LDn during the ON period T2 is larger than a forward voltage Vf1a of the laser diodes LD1 to LDn during ON period T1. Similarly, as illustrated in (d) of FIG. 9, a voltage drop Rall×If2 at the resistance Rall during the ON period T2 is larger than a voltage drop Rall×If1 at the resistance Rall during the ON period T1.

(e) of FIG. 9 illustrates a waveform of the output voltage Vcc of the DC power supply 102. The DC power supply 102, which is a constant voltage source, has a constant voltage value Vcc0. Thus, the current driving element 103 has a voltage Vds across its controlled terminals (that is, the voltage across the drain and the source; hereinafter referred to as "inter-terminal voltage") which voltage Vds is different between the ON period T1 and the ON period T2.

Specifically, $$Vds1a = Vcc0 - Vf1a - Rall \times If1,$$

where Vds1a represents an inter-terminal voltage of the current driving element 103 during the ON period T1. Further, $$Vds2a = Vcc1 - Vf2a - Rall \times If2,$$

where Vds2a represents an inter-terminal voltage of the current driving element 103 during the ON period T2.

Since (i) Vf1a<Vf2a, (ii) Rall×If1<Rall×If2, and (iii) the output voltage Vcc of the DC power supply 102 is constant, $$Vds1a > Vds2a$$

unless the current If is 0 (see (f) of FIG. 9). As described above, the laser diode driving device 101 is arranged such that a change in the current through the laser diodes LD1 to LDn changes the inter-terminal voltage of the current driving element 103.

The above arrangement results in a large difference between (i) power consumption Vds2a×If2 by the current driving element 103 during the ON period T2 and (ii) power consumption Vds1a×If1 by the current driving element 103 during the ON period T1 (see (g) of FIG. 9). Large power consumption by a current driving element may break down that current driving element due to a temperature rise. Further, since the current driving element 103 is incapable of controlling the amount of a current through the laser diodes in a non-saturation region, the inter-terminal voltage Vds needs to have a value equal to or greater than a value that allows the current driving element 103 to operate in a saturation region.

Patent Literature 3, in contrast, discloses an invention that (i) includes a variable power supply as a power supply for driving laser diodes, (ii) monitors an inter-terminal voltage of a current driving element, and (iii) controls output of the variable power supply so that the inter-terminal voltage being monitored is equal to a predetermined voltage value. This arrangement allows the inter-terminal voltage of the current driving element to be constant regardless of the amount of a current through the laser diodes. The above arrangement can thus (i) reduce the width of variation in power consumption by the current driving element, (ii) reduce power consumption by the current driving element, and (iii) prevent the current driving element from generating heat.

CITATION LIST

Patent Literature 1

Japanese Patent Application Publication, *Tokukai*, No. 2006-210835 A (Publication Date: Aug. 10, 2006)

Patent Literature 2

PCT International Publication No. 2004/057924 Pamphlet (International Publication Date: Jul. 8, 2004)
Patent Literature 3
Japanese Patent Application Publication, *Tokukaihei*, No. 6-275895 A (Publication Date: Sep. 30, 1994)

SUMMARY OF INVENTION

Technical Problem

The invention disclosed in Patent Literature 3 carries out feedback control for the output of the variable power supply on the basis of the monitored inter-terminal voltage of the current driving element. This unfortunately causes the inter-terminal voltage of the current driving element to change at the moment at which the current through the laser diodes changes. The inter-terminal voltage of the current driving element thus requires a predetermined time period before it is stabilized. In the case where the current driving element has been switched from a non-conductive state to a conductive state, the current through the laser diodes rises at timing that depends on the inter-terminal voltage of the current driving element. Thus, in the case where the laser diodes are, in particular, pulse-driven as illustrated in (a) of FIG. 9, the invention disclosed in Patent Literature 3 problematically causes the output of the laser diodes to rise late.

Further, Patent Literature 3, which carries out feedback control for output of a variable power supply, requires including, as separate members, such circuits as a voltage monitor circuit, a differential integrating amplifier circuit, and a reference voltage source. This unfortunately leads to a laser diode driving device being high in circuit complexity.

The present invention has been accomplished to solve the above problem. It is an object of the present invention to produce a fiber laser device that is capable of causing laser light output of an amplification fiber to constantly rise rapidly with use of a simple arrangement.

Solution to Problem

In order to solve the above problem, a fiber laser device of the present invention includes: an amplification fiber; an excitation light source for exciting the amplification fiber; and a light source driving device for driving the excitation light source, the light source driving device including: a variable power supply for outputting a voltage for driving a semiconductor light source; a current driving element for causing a current to flow through the semiconductor light source, the current driving element being connected to the semiconductor light source in series; a current control section for controlling (i) turning on and off of the current driving element and (ii) an amount of the current; and a power supply control section for controlling the voltage outputted by the variable power supply, the light source driving device further including: a storage section storing (i) current-voltage characteristic data indicative of a characteristic of a forward voltage of the semiconductor light source with respect to the current and (ii) voltage drop characteristic data indicative of a characteristic of a voltage drop at a resistance with respect to the current, the resistance being of a component of a circuit constituted by the variable power supply, the semiconductor light source, and the current driving element, the component being a component other than the semiconductor light source and the current driving element, the current control section, in a case of switching amounts of the current, causing the current driving element to be off during an intermediate period between (i) a first period during which the current before the switch flows and (ii) a second period during which the current after the switch flows, the power supply control section changing the output voltage during the intermediate period on a basis of the current-voltage characteristic data and the voltage drop characteristic data so that a difference between (i) a voltage across controlled terminals of the current driving element during the first period and (ii) the voltage across the controlled terminals of the current driving element during the second period has a value smaller than a value of the difference for a case in which the output voltage is constant throughout the first period and the second period.

According to the above arrangement, the current control section turns on the current driving element to (i) cause a current to flow through the semiconductor light source and thus (ii) drive the semiconductor element. Further, the storage section stores current-voltage characteristic data and voltage drop characteristic data, on the basis of each of which the power supply control section controls the output voltage of the variable power supply. More specifically, when the current control section switches amounts of the current that is to flow through the semiconductor light source, the output voltage is controlled so that the difference between (i) the voltage across the controlled terminals of the current driving element during the first period and (ii) the voltage across the controlled terminals of the current driving element during the second period has a value smaller than the value that the difference will have between (i) the voltage across the controlled terminals of the current driving element during the first period and (ii) the voltage across the controlled terminals of the current driving element during the second period in the case where the output voltage is constant throughout the first period and the second period. In other words, when there has been a change to the current that is to flow through the semiconductor light source, the voltage across the controlled terminals of the current driving element changes within a range smaller than the range within which the voltage across the controlled terminals of the current driving element will change in the case where the output voltage is constant. The above arrangement can thus reduce the risk of the current driving element breaking down due to a temperature rise or becoming unable to control the amount of the current that is to flow through the semiconductor light source.

Further, according to the above arrangement, the power supply control section changes the output voltage at timing during a period between the first and second periods during which period the current driving element is off. The above arrangement can thus (i) control the voltage across the controlled terminals to a desired value before the second period starts, and (ii) control, to a desired value, a rise period for the current that the current driving element causes to flow. The above arrangement consequently allows the output of the semiconductor light source to rise more rapidly than an arrangement of monitoring the voltage across controlled terminals to carry out feedback control for the output voltage of a variable power supply. In addition, the above arrangement (i) can use, as the storage section, a memory for use in a normal light source driving device, and (ii) does not require, for example, a circuit for feedback control for an output voltage. The above arrangement thus makes it possible to produce a light source driving device that is capable of causing output of a semiconductor light source to constantly rise rapidly with use of a simple arrangement. This makes it possible to provide a fiber laser device that is capable of causing laser light output of an amplification fiber to constantly rise rapidly with use of a simple arrangement.

Advantageous Effects of Invention

As described above, a fiber laser device of the present invention includes: an amplification fiber; an excitation light source for exciting the amplification fiber; and a light source driving device for driving the excitation light source, the light source driving device including: a variable power supply for outputting a voltage for driving a semiconductor light source; a current driving element for causing a current to flow through the semiconductor light source, the current driving element being connected to the semiconductor light source in series; a current control section for controlling (i) turning on and off of the current driving element and (ii) an amount of the current; and a power supply control section for controlling the voltage outputted by the variable power supply, the light source driving device further including: a storage section storing (i) current-voltage characteristic data indicative of a characteristic of a forward voltage of the semiconductor light source with respect to the current and (ii) voltage drop characteristic data indicative of a characteristic of a voltage drop at a resistance with respect to the current, the resistance being of a component of a circuit constituted by the variable power supply, the semiconductor light source, and the current driving element, the component being a component other than the semiconductor light source and the current driving element, the current control section, in a case of switching amounts of the current, causing the current driving element to be off during an intermediate period between (i) a first period during which the current before the switch flows and (ii) a second period during which the current after the switch flows, the power supply control section changing the output voltage during the intermediate period on a basis of the current-voltage characteristic data and the voltage drop characteristic data so that a difference between (i) a voltage across controlled terminals of the current driving element during the first period and (ii) the voltage across the controlled terminals of the current driving element during the second period has a value smaller than a value of the difference for a case in which the output voltage is constant throughout the first period and the second period. This advantageously makes it possible to produce a fiber laser device that is capable of causing laser light output of an amplification fiber to constantly rise rapidly with use of a simple arrangement.

DESCRIPTION OF EMBODIMENTS

Embodiment 1

The description below deals with a first embodiment of the present invention with reference to FIGS. 1 through 5.

(Arrangement of Fiber Laser Device)

Figure 1:
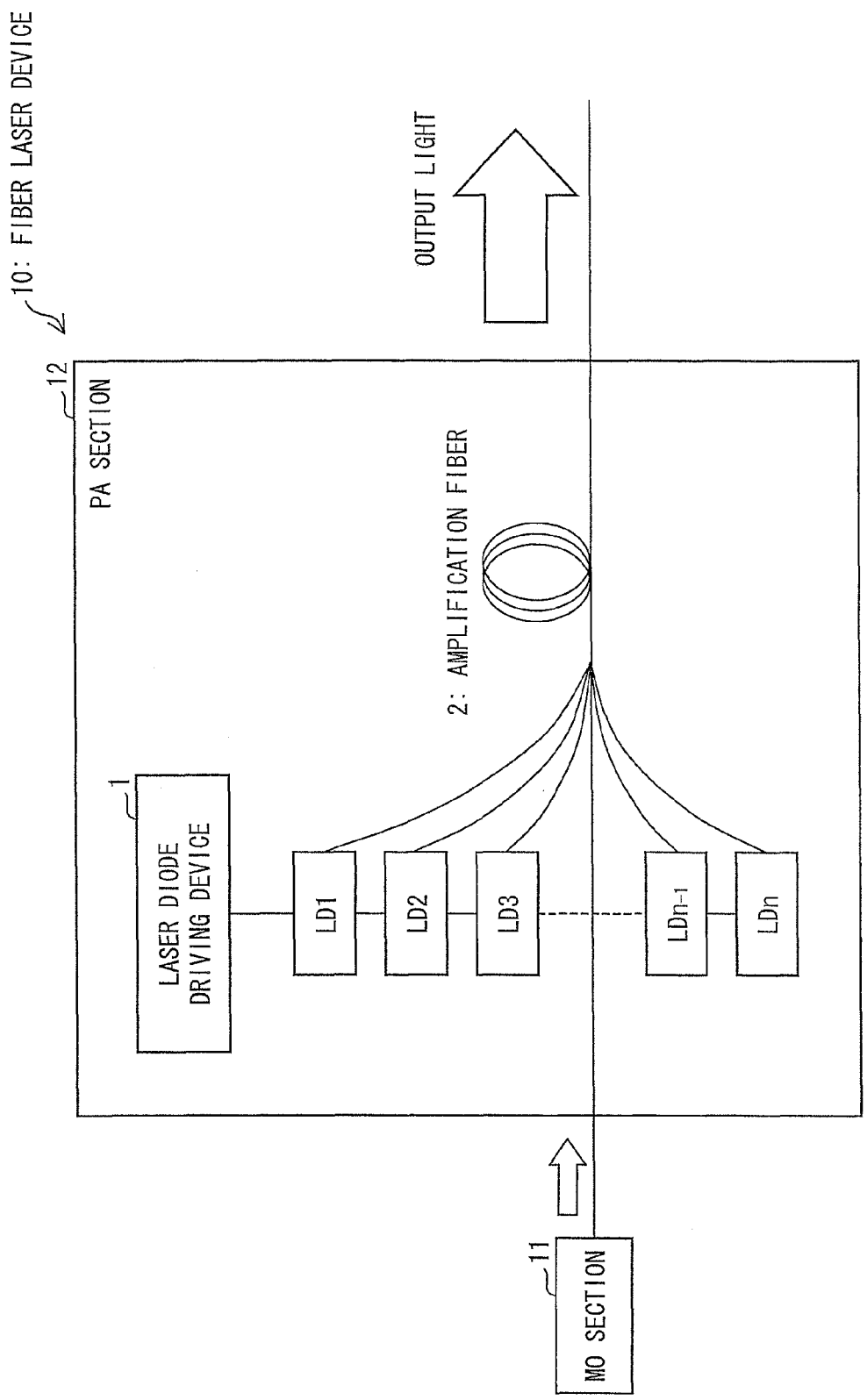
FIG. 1 is a diagram schematically illustrating a configuration of a fiber laser device of a first embodiment of the present invention.

FIG. 1 is a diagram schematically illustrating a configuration of a fiber laser device 10 of the present embodiment. The fiber laser device 10 is a fiber laser device of an MOPA system, that is, a fiber laser device that carries out pulse oscillation with use of a combination of a master oscillator and a light amplifier. The fiber laser device 10 includes: an MO section 11 serving as an oscillation section; and a PA section 12 serving as an amplification section.

The PA section 12 includes: n laser diodes LD1 to LDn connected to one another in series; a laser diode driving device (light source driving device) 1; and an amplification fiber 2. The amplification fiber 2 is arranged such that (i) its ends on one side receive excitation light from the individual laser diodes LD1 to LDn and signal light from the MO section 11 and that (ii) its core includes, added thereto, a rare earth element such as ytterbium (Yb) and erbium (Er). This arrangement allows the amplification fiber 2 to (i) amplify signal light from the MO section 11 and (ii) emit laser light from its end on the other side to a processing target object.

(Arrangement of Laser Diode Driving Device)

The laser diode driving device 1 is a device for driving the laser diodes LD1 to LDn. The following describes an arrangement of the laser diode driving device 1 in detail.

Figure 2:
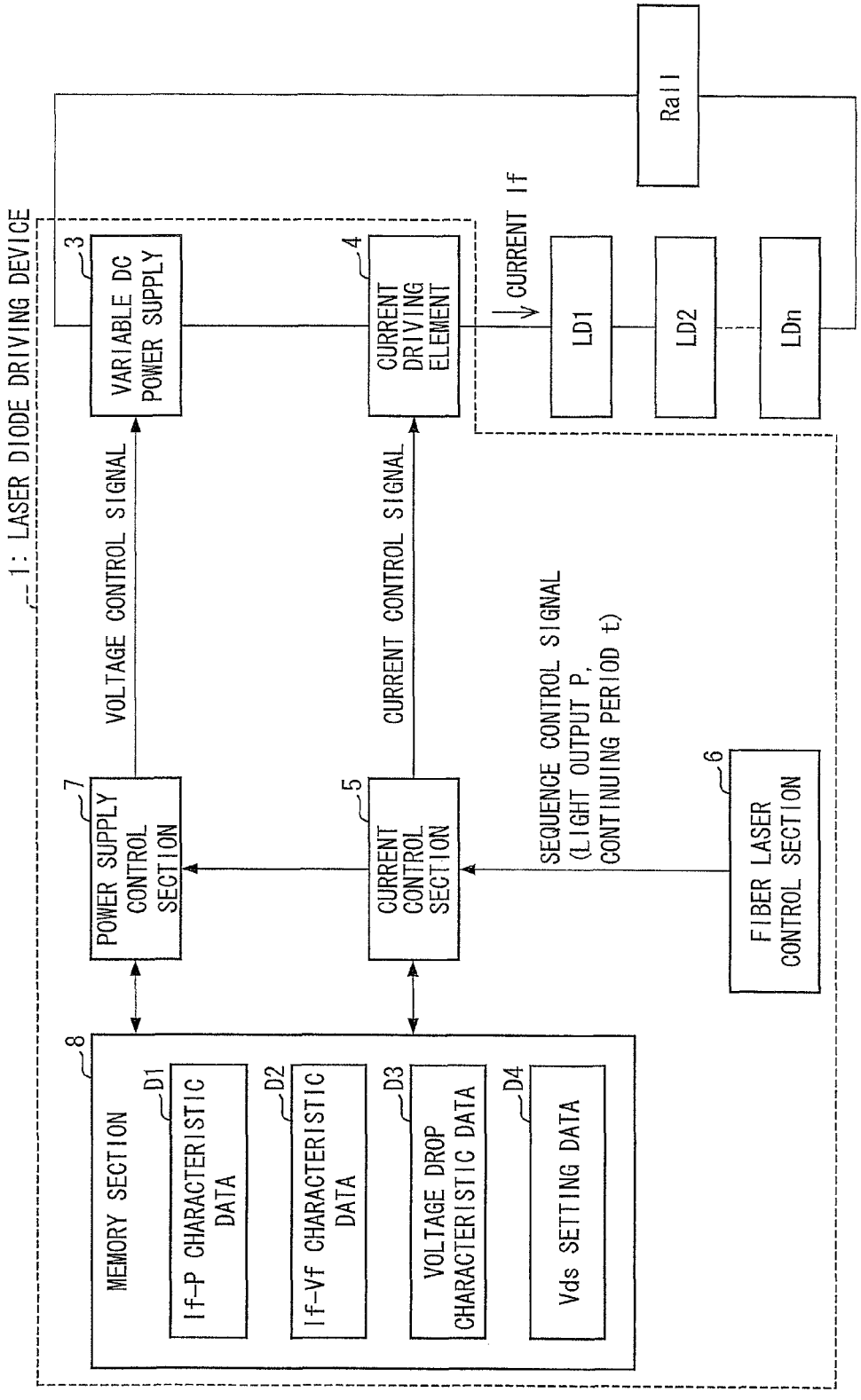
FIG. 2 is a block diagram illustrating a configuration of a laser diode driving device of the first embodiment of the present invention.

FIG. 2 is a block diagram illustrating a configuration of the laser diode driving device 1 of the present embodiment. The laser diode driving device 1 includes: a variable DC power supply 3; a current driving element 4; a current control section 5; a fiber laser control section 6; a power supply control section 7; and a memory section 8.

The variable DC power supply 3 is a variable voltage source that outputs a voltage Vcc for driving the laser diodes LD1 to LDn, the voltage Vcc being changed in correspondence with a voltage control signal from the power supply control section 7. The current driving element 4 is provided between the variable DC power supply 3 and the laser diodes LD1 to LDn, and includes, for example, an N-channel type MOS transistor. The current driving element 4 is turned ON and OFF in correspondence with a current control signal from the current control section 5. The current driving element 4, when in a conductive state, causes a current If to flow through the laser diodes LD1 to LDn. The current If has an amount that is changed in correspondence with the voltage of the current control signal (that is, a gate voltage Vg of the current driving element 4).

The fiber laser control section 6 supplies, on the basis of a preset sequence program, the current control section 5 with a sequence control signal indicative of a light output P and output continuing period t for the laser diodes LD1 to LDn. The current control section 5 outputs, on the basis of the sequence control signal, a current control signal to a control terminal (gate terminal) of the current driving element 4 to control (i) turning ON and OFF of the current driving element 4 and (ii) the amount of the current If. FIG. 2 shows Rall, which indicates resistance in the circuit constituted by the variable DC power supply 3, the current driving element 4, and the laser diodes LD1 to LDn which resistance is of wiring and the like excluding the current driving element 4 and the laser diodes LD1 to LDn.

The memory section 8 includes, for example, a nonvolatile semiconductor memory, and is similar to a memory device included in a common fiber laser device. The memory section 8 stores If-P characteristic data D1, If-Vf characteristic data (current-voltage characteristic data) D2, voltage drop characteristic data D3, and Vds setting data (voltage setting data) D4.

The current control section 5 and the power supply control section 7 are each capable of accessing the memory section 8. The above data is referred to by the current control section 5 and the power supply control section 7. The If-P characteristic data D1 is data indicative of the relationship between (i) the current If flowing through the laser diodes LD1 to LDn and (ii) the light output P of the laser diodes LD1 to LDn. The If-Vf characteristic data D2 is data indicative of the relationship between (i) a current If flowing through the laser diodes LD1 to LDn at a predetermined temperature T1$a$ and (ii) a forward voltage Vf of the laser diodes LD1 to LDn. The forward voltage Vf refers to the sum of the respective forward voltages of the laser diodes LD1 to LDn. The voltage drop characteristic data D3 is data indicative of the relationship between (i) the current If flowing through the laser diodes LD1 to LDn and (ii) a voltage drop at the resistance Rall. The If-P characteristic data D1, the If-Vf characteristic data D2, and the voltage drop characteristic data D3 are obtained during a characteristic data obtaining process described below, and are thus stored in the memory section 8.

The Vds setting data D4 is data indicative of the value of a predetermined voltage Vds across controlled terminals of the current driving element 4 (that is, the voltage across the drain and the source; hereinafter referred to as "inter-terminal voltage"). This value is determined in correspondence with (i) a I-V characteristic of the current driving element 4 and (ii) a specification range of the current If. The present embodiment sets the inter-terminal voltage Vds to a voltage value Vdsmin, which is a minimum voltage value that allows the current driving element 4 to control the amount of the current If.

(Operation of Laser Diode Driving Device 1)

Figure 3:
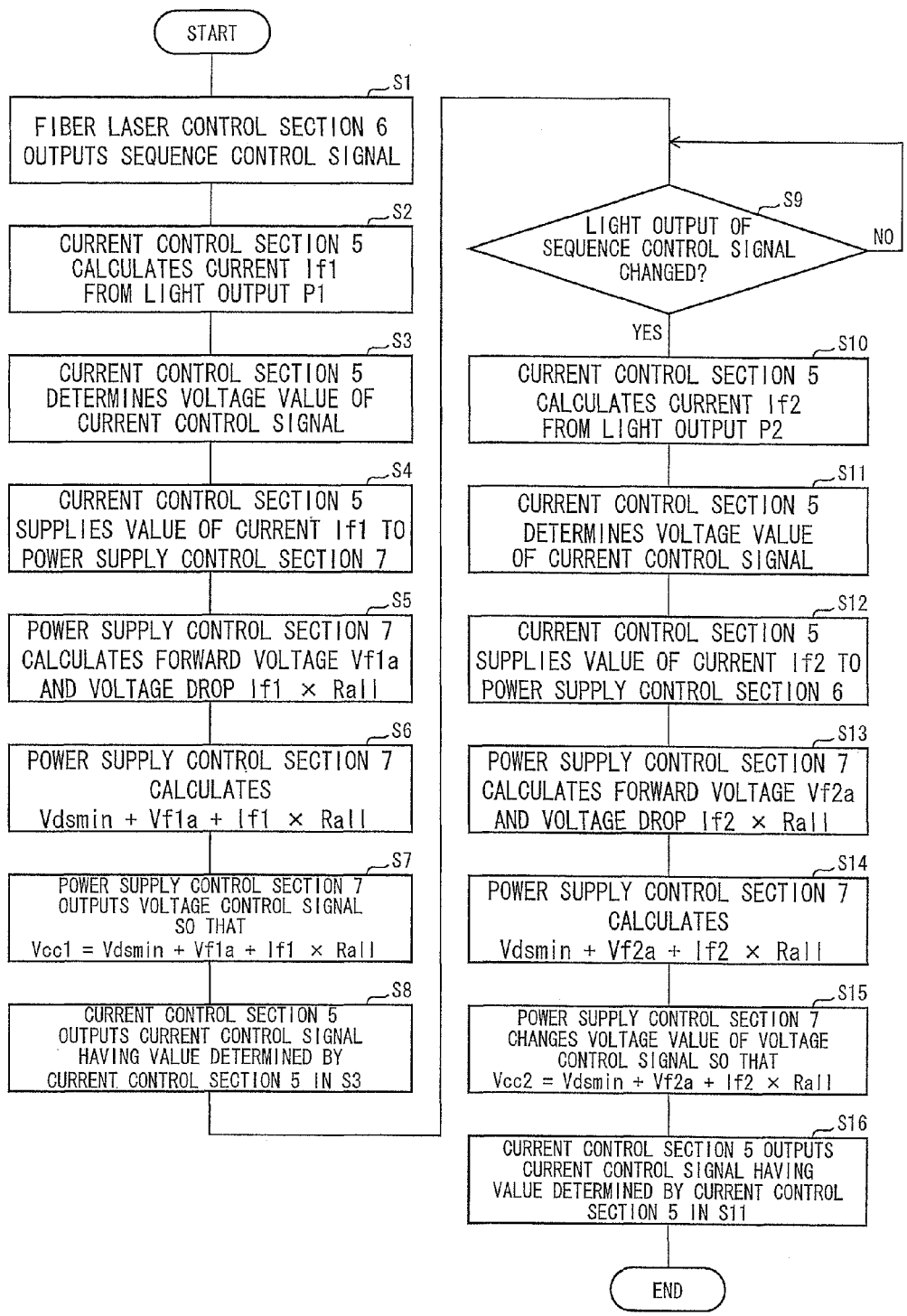
FIG. 3 is a flowchart illustrating a sequence of an operation of the laser diode driving device illustrated in FIG. 2.
Figure 4:
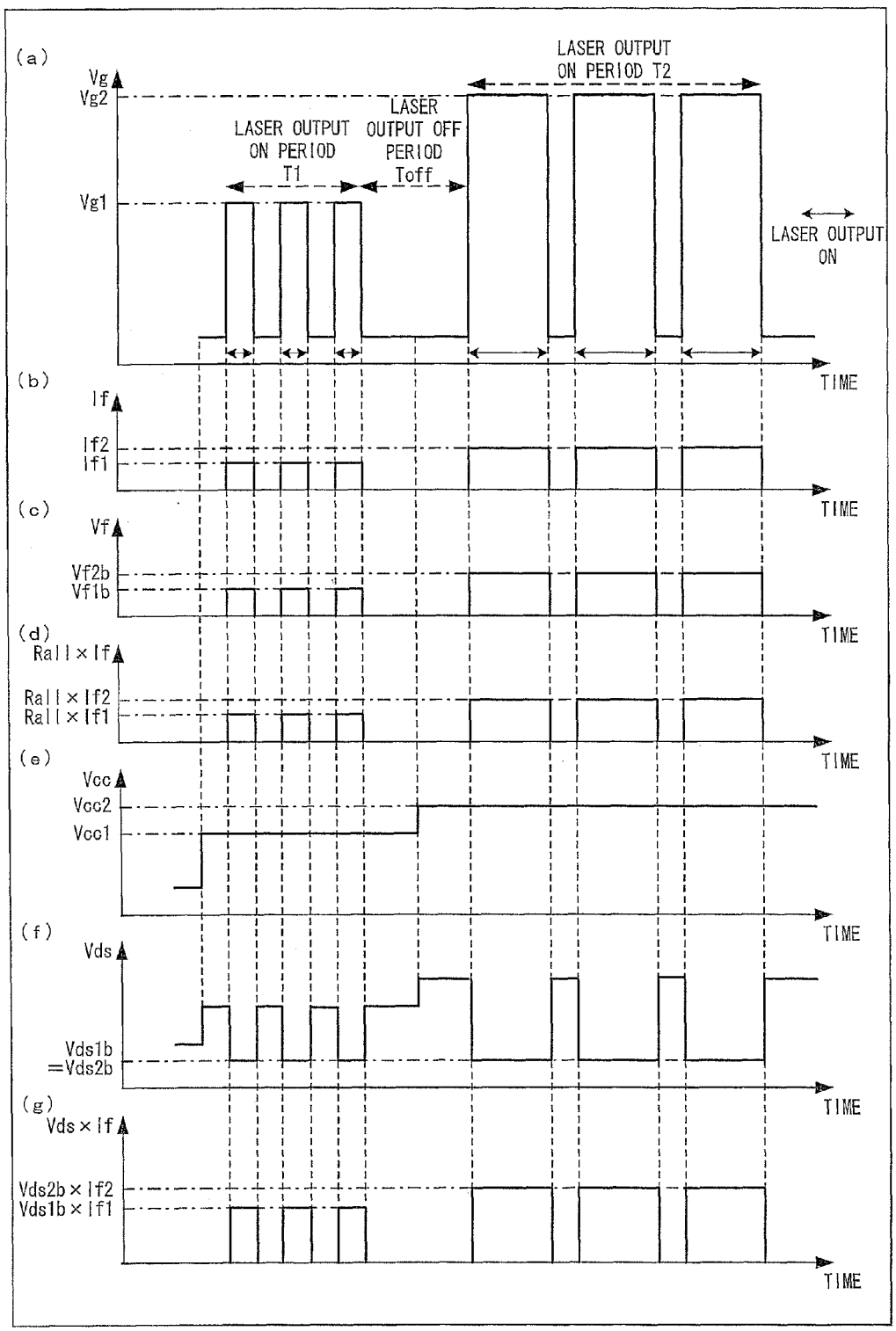
FIG. 4 is a diagram illustrating respective waveforms of, for example, (i) a voltage control signal from a power supply control section of the laser diode driving device and (ii) a current If that flows through laser diodes.

The following describes, with reference to FIGS. 3 and 4, an operation of the laser diode driving device 1 for the case in which the laser diodes LD1 to LDn (i) output a light output P1 during an ON period T1 and (ii) output a light output P2 (P1<P2) during an ON period T2.

FIG. 3 is a flowchart illustrating a sequence of the operation of the laser diode driving device 1. First, the fiber laser control section 6 supplies, on the basis of a preset sequence program, the current control section 5 with a sequence control signal indicative of (i) a light output P1 to be outputted by the laser diodes LD1 to LDn and (ii) an output continuing period t (S1). Then, the current control section 5 (i) accesses the memory section 8 to refer to the If-P characteristic data D1 and (ii) calculates, from the light output P1, a current If1 that is to flow through the laser diodes LD1 to LDn (S2). The current control section 5 thus determines a voltage value for a current control signal to be supplied to the current driving element 4 (S3), and supplies the value of the calculated current If1 to the power supply control section 7 (S4). The current control section 5 does not output a current control signal at this stage.

The power supply control section 7 then accesses the memory section 8 to refer to the If-Vf characteristic data D2 and the voltage drop characteristic data D3, and calculates (i) a forward voltage Vf1$a$ of the laser diodes LD1 to LDn for the case in which the current If1 is to flow and (ii) a voltage drop If1×Rall at the resistance Rall (S5). The power supply control section 7 further (i) refers to the Vds setting data D4, (ii) calculates the sum of a voltage Vdsmin indicated by the Vds setting data D4, the forward voltage Vf1$a$, and the voltage drop If1×Rall, and (iii) sets the calculated sum as an output voltage Vcc1 of the variable DC power supply 3 (S6). The power supply control section 7 supplies a voltage control signal to the variable DC power supply 3 so that the output voltage of the variable DC power supply 3 is set to Vcc1 (S7). After the output voltage of the variable DC power supply 3 has been set to Vcc1, the current control section 5 supplies the current driving element 4 with a current control signal having the voltage value determined in S3 (S8). This causes the current If1 to flow through the laser diodes LD1 to LDn during the ON period T1.

Next, in the case where the light output P1 indicated by the sequence control signal from the fiber laser control section 6 has been switched to a light output P2 (YES in S9), the power supply control section 7 changes the output voltage of the variable DC power supply 3 from Vcc1 to Vcc2. Specifically, the current control section 5 (i) accesses the memory section 8 to refer to the If-P characteristic data D1 and (ii) calculates, from the light output P2, a current If2 that is to flow through the laser diodes LD1 to LDn during the light output P2 (S10). The current control section 5 thus determines a voltage value for a current control signal to be supplied to the current driving element 4 (S11), and supplies the value of the calculated current If2 to the power supply control section 7 (S12).

The power supply control section 7 then (i) accesses the memory section 8 to refer to the If-Vf characteristic data D2 and the voltage drop characteristic data D3 and (ii) calculates a forward voltage Vf2a of the laser diodes LD1 to LDn and a voltage drop If2×Rall at the resistance Rall for the case in which the current If2 is to flow (S13). The power supply control section 7 further (i) refers to the Vds setting data D4, (ii) calculates the sum of the voltage Vdsmin indicated by the Vds setting data D4, the forward voltage Vf2a, and the voltage drop If2×Rall, and (iii) sets the calculated sum as an output voltage Vcc2 of the variable DC power supply 3 (S14). The power supply control section 7 switches the voltage control signal to another voltage control signal to be supplied to the variable DC power supply 3 so that the output voltage of the variable DC power supply 3 is set to Vcc2 (S15). After the output voltage of the variable DC power supply 3 has been set to Vcc2, the current control section 5 supplies the current driving element 4 with a current control signal having the voltage value determined in S11 (S16). This causes the current If2 to flow through the laser diodes LD1 to LDn during the ON period T2.

(*a*) through (*g*) of FIG. 4 illustrate respective waveforms of, for example, (i) a voltage control signal from the power supply control section 7 and (ii) a current If through the laser diodes LD1 to LDn for the case in which the laser diode driving device 1 operates as described above.

(*a*) of FIG. 4 illustrates a waveform of the current control signal outputted by the current control section 5 (that is, the gate voltage Vg of the current driving element 4). During the ON period T1, in which the light output of the fiber laser device 10 is P1, the gate voltage is Vg1. During the ON period T2, in which the light output of the fiber laser device 10 is P2 (P2>P1), the gate voltage is Vg2. The current control section 5, as described above, changes the gate voltage to switch the amount of the current If to a different amount. The current control section 5, in the case where it switches amounts of the current If, turns the current driving element 4 OFF between the ON period T1 and the ON period T2. Specifically, there is provided between the ON period T1 and the ON period T2 an OFF period Toff, in which laser output is OFF.

(*b*) of FIG. 4 illustrates a waveform of the current If through the laser diodes LD1 to LDn. Since Vg1<Vg2, the current If2 during the ON period T2 is larger than the current If1 during the ON period T1.

(*c*) of FIG. 4 illustrates the forward voltage Vf of the laser diodes LD1 to LDn. Since the forward voltage is proportional to the current flowing through the laser diodes, the forward voltage Vf2a during the ON period T2 is higher than the forward voltage Vf1a during the ON period T1.

(*d*) of FIG. 4 illustrates a voltage drop at the resistance Rall. Since If1<If2, a voltage drop Rall×If2 during the ON period T2 is larger than a voltage drop Rall×If1 during the ON period T1.

(*e*) of FIG. 4 illustrates a waveform of the output voltage Vcc of the variable DC power supply 3. In the case where the current through the laser diodes LD1 to LDn has been changed from If1 to If2, a voltage control signal from the power supply control section 7 changes the output voltage of the variable DC power supply 3 from Vcc1 to Vcc2. The output voltages Vcc1 and Vcc2 are expressed as follows (see S7 and S15 in FIG. 3):

$$Vcc1 = Vdsmin + Vf1a + If1 \times Rall \quad (1)$$

$$Vcc2 = Vdsmin + Vf2a + If2 \times Rall \quad (2)$$

(*f*) of FIG. 4 illustrates the inter-terminal voltage of the current driving element 4. Supposing that an inter-terminal voltage of the current driving element 4 during the ON period T1 is Vds1*b* and that an inter-terminal voltage of the current driving element 4 during the ON period T2 is Vds2*b*, the total voltage drop during the ON period T1 in the circuit constituted by the variable DC power supply 3, the current driving element 4, and the laser diodes LD1 to LDn is expressed as Vds1*b*+Vf1*a*+If1×Rall. Since this voltage drop is equal to the output voltage Vcc1 of the variable DC power supply 3, $$Vds1b + Vf1a + If1 \times Rall = Vdsmin + Vf1a + If1 \times Rall$$

$$Vds1b = Vdsmin$$

as determined by Formula (1). Similarly, the total voltage drop during the ON period T2 in the circuit constituted by the variable DC power supply 3, the current driving element 4, and the laser diodes LD1 to LDn is expressed as Vds2*b*+Vf2*a*+If2×Rall. Since this voltage drop is equal to the output voltage Vcc2 of the variable DC power supply 3, $$Vds2b + Vf2a + If2 \times Rall = Vdsmin + Vf2a + If2 \times Rall$$

$$Vds2b = Vdsmin$$

as determined by Formula (2). Therefore, $$Vds1b = Vds2b = Vdsmin.$$

As described above, the laser diode driving device 1 is arranged such that even if there has been a change in the current If flowing through the laser diodes LD1 to LDn, the inter-terminal voltage Vds of the current driving element 4 is constant at Vdsmin during a period in which the current If is not 0. This arrangement can prevent the inter-terminal voltage Vds from having, due to the current If, (i) a value that is not greater than a value that allows the current driving element 4 to control the current If or (ii) a value that is not smaller than a value that causes the current driving element 4 to break down due to a temperature rise. Further, since the voltage Vdsmin is a voltage that is minimally required for the current driving element 4 to control the current If, the above arrangement can reduce power consumption of the current driving element 4 to a minimum as illustrated in (*g*) of FIG. 4. The above arrangement can further minimize a temperature rise caused by heat generation, and thus improves output efficiency of the laser diodes LD1 to LDn.

Further, as illustrated in (*e*) of FIG. 4, the power supply control section 7 changes the output voltage Vcc of the variable DC power supply 3 during the OFF period Toff, which is between the ON period T1 and the ON period T2 and in which the current driving element 4 is OFF. This arrangement allows the inter-terminal voltage Vds of the current driving element 4 to be at Vdsmin before the voltage control signal from the power supply control section 7 first rises during the ON period T2.

The invention disclosed in Patent Literature 3 carries out feedback control for output of a variable power supply on the basis of the inter-terminal voltage of a current driving element. Thus, at the time at which the laser output is first outputted after it has been switched, the inter-terminal voltage of the current driving element is different from that applied before the laser output has been switched. The current through the laser diodes rises at timing that depends on the inter-terminal voltage of the current driving element. The invention disclosed in Patent Literature 3 consequently causes the output of the laser diodes to rise late.

The present embodiment is, in contrast, arranged such that even at the time at which the laser output is first outputted after it has been switched, the inter-terminal voltage of the current driving element is equal to that applied before the laser output has been switched. With this arrangement, the current driving element can produce a current that rises at constant timing. This in turn allows the output of the laser diodes to constantly rise rapidly. Further, the laser diode driving device 1 (i) requires no circuits for monitoring the inter-terminal voltage of the current driving element and carrying out feedback control for the output of the variable power supply, and (ii) can use, as the memory section 8, a memory included in a common laser diode driving device. This can reduce circuit complexity.

(Obtaining Characteristic Data)

The description below deals with a characteristic data obtaining process for obtaining If-P characteristic data D1, If-Vf characteristic data D2, and voltage drop characteristic data D3 to be stored in the memory section 8. Performing this process involves providing, to the laser diode driving device 1, a sensor for measuring respective values of (i) the forward voltage of the laser diodes LD1 to LDn, (ii) the current If through the laser diodes LD1 to LDn, and (iii) the light output P of the laser diodes LD1 to LDn. This process is performed before the laser diode driving device 1 is operated.

Figure 5:
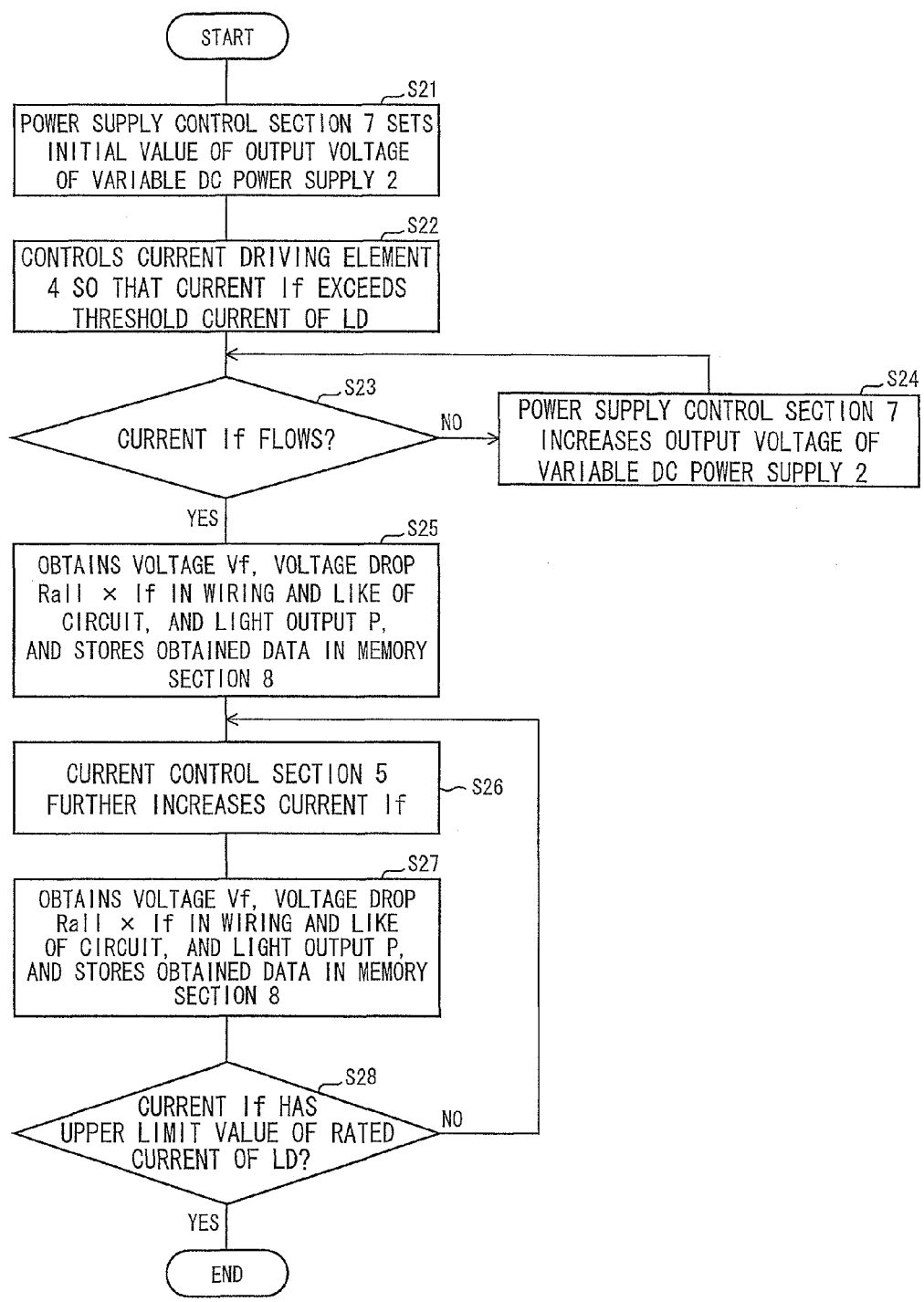
FIG. 5 is a flowchart illustrating a procedure of a characteristic data obtaining process.

FIG. 5 is a flowchart illustrating a procedure for the characteristic data obtaining process. First, the power supply control section 7 sets an initial value of the output voltage of the variable DC power supply 3 (S21). Then, the current control section 5 controls the current driving element 4 so that the current If through the laser diodes LD1 to LDn exceeds the respective threshold currents of the laser diodes LD1 to LDn (S22).

In the case where the current If does not flow (NO in S23), the power supply control section 7 increases the output voltage of the variable DC power supply 3 (S24). The cycle of S23 and S24 is repeated until the current If flows.

In the case where the current If flows (YES in S23), the process obtains data of (i) a forward voltage Vf, (ii) a voltage drop Rall×If in the wiring and the like of the circuit, and (iii) a light output P of the laser diodes LD1 to LDn, all achieved at this stage. The process then stores the obtained data in the memory section 8 (S25).

Next, the current control section 5 further increases the current If (S26). Then, the process obtains data of (i) a forward voltage Vf, (ii) a voltage drop Rall×If in the wiring and the like of the circuit, and (iii) a light output P of the laser diodes LD1 to LDn, all achieved at this stage. The process then stores the obtained data in the memory section 8 (S27). The cycle of S26 and S27 is repeated until the current If reaches the upper limit value of the rated current of the laser diodes LD1 to LDn. In the case where the current If is not increased in S26 due to a low forward voltage Vf, the process increases the output voltage of the variable DC power supply 3.

In the case where the current If has a value equal to the upper limit value of the rated current of the laser diodes LD1 to LDn (YES in S28), the characteristic data obtaining process ends. This process allows the memory section 8 to store If-P characteristic data D1, If-Vf characteristic data D2, and voltage drop characteristic data D3.

(Recap)

The present embodiment is, as described above, arranged to (i) control the output voltage of the variable DC power supply 3 with reference to If-P characteristic data D1, If-Vf characteristic data D2, and voltage drop characteristic data D3 obtained in advance through the characteristic data obtaining process and (ii) switch values of the output voltage of the variable DC power supply 3 during an OFF period Toff, in which the current driving element 4 is OFF. Thus, unlike a conventional arrangement of carrying out feedback control for output of a variable power supply on the basis of the inter-terminal voltage of a current driving element, the present embodiment allows output of laser diodes LD1 to LDn to constantly rise rapidly with use of a simple arrangement.

Further, even in the case where there has occurred (i) a change in the number of the laser diodes, (ii) a variation in the current-voltage characteristic of the individual laser diodes, or (iii) a change in the value of resistance in the wiring and the like of the circuit, the present embodiment can, by performing the characteristic data obtaining process again to update the If-P characteristic data, the If-Vf characteristic data, and the voltage drop characteristic data stored in the memory section, fix the inter-terminal voltage of the current driving element through control of the output voltage of the variable DC power supply.

Embodiment 2

The description below deals with a second embodiment of the present invention with reference to FIGS. 6 and 7. A laser diode has a forward voltage with temperature dependence. A typical laser diode has a forward voltage that becomes lower with a temperature increase. Thus, even if a laser diode has a constant light output, the current driving element has an inter-terminal voltage that becomes higher over time after the start of the output. In view of this, the present embodiment describes an arrangement of, in further consideration of temperature dependence of the forward voltage, controlling the output voltage of a variable DC power supply so that the current driving element has a constant inter-terminal voltage. For convenience of explanation, members of the present embodiment that are identical in function to the respective corresponding members described in the first embodiment above are each assigned a common reference numeral, and are not described here.

Figure 6:
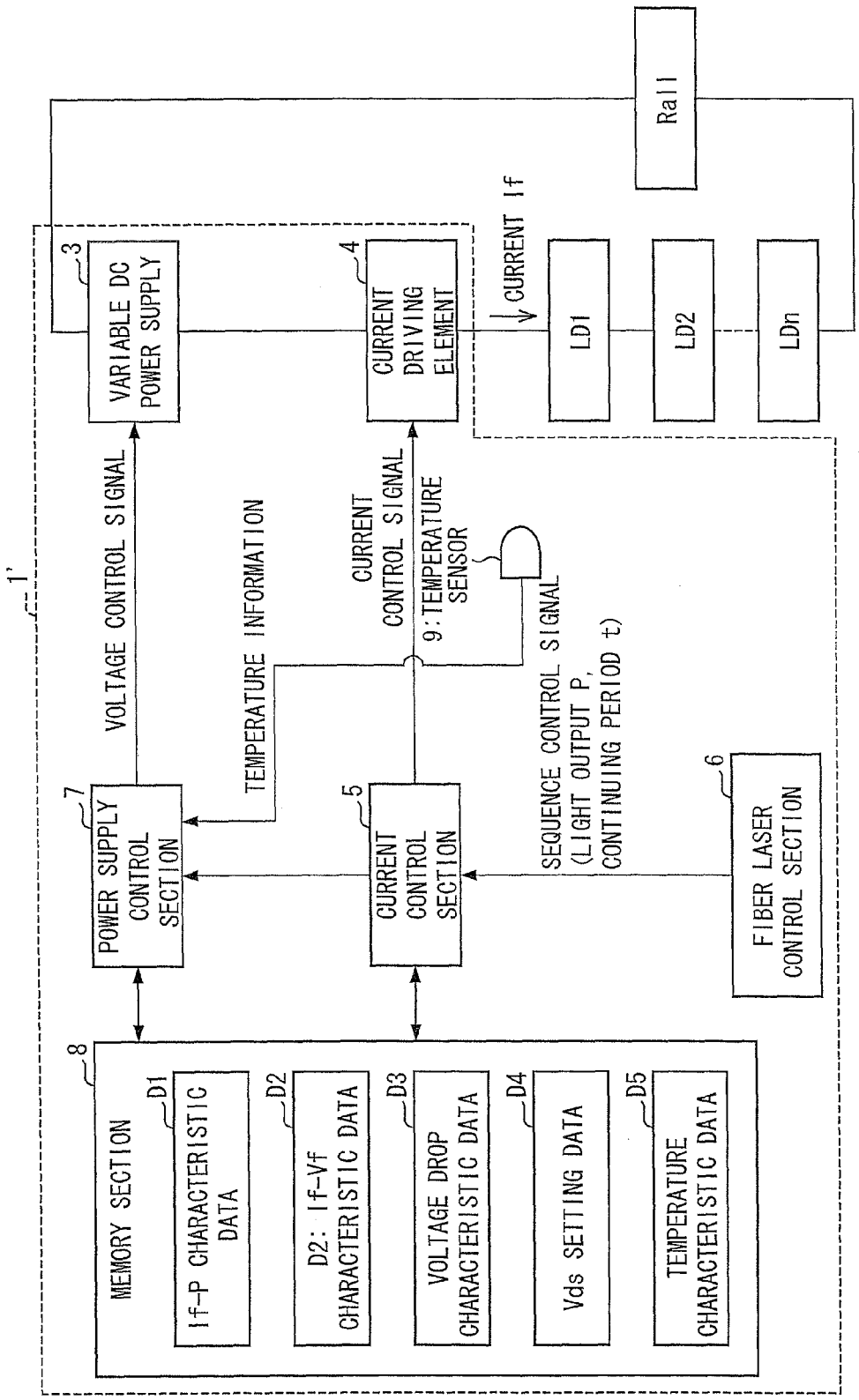
FIG. 6 is a block diagram illustrating a configuration of a laser diode driving device of a second embodiment of the present invention.

FIG. 6 is a block diagram illustrating a configuration of a laser diode driving device 1' of the present embodiment. The laser diode driving device 1' is identical in configuration to the laser diode driving device 1 of the first embodiment except that it further includes a temperature sensor 9 and that the memory section 8 further stores temperature characteristic data D5. The temperature sensor 9 is provided in the vicinity of the laser diodes LD1 to LDn. The temperature sensor 9 (i) measures the temperature of the laser diodes LD1 to LDn once every predetermined time period and (ii) supplies temperature information indicative of the measured temperature to the power supply control section 7.

The temperature characteristic data D5 is data indicative of the characteristic of the forward voltage with respect to the temperature of the laser diodes LD1 to LDn. The data indicative of the characteristic of the forward voltage is, in the present embodiment, data indicative of the temperature coefficient $\alpha$ (V/° C.) of the forward voltage of each of the laser diodes LD1 to LDn, the temperature coefficient $\alpha$ being derived from data provided by the maker of the laser diodes.

The temperature characteristic data D5 is obtained in advance before the laser diode driving device 1 is operated. The power supply control section 7 refers to the temperature characteristic data D5 in addition to the If-Vf characteristic data D2, the voltage drop characteristic data D3, and the Vds setting data D4, to produce a voltage control signal.

(Operation of Laser Diode Driving Device 1')

Figure 7:
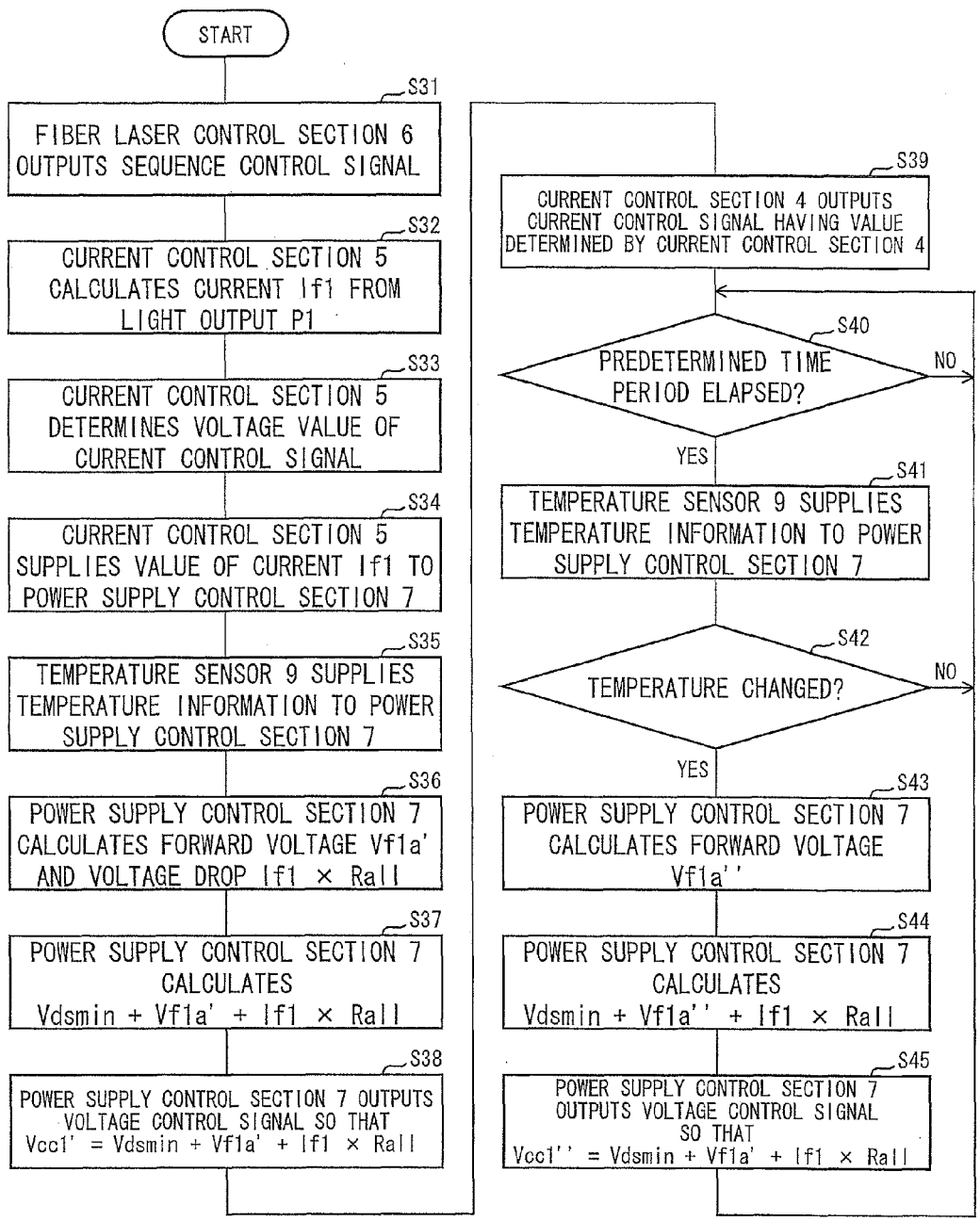
FIG. 7 is a flowchart illustrating a sequence of an operation of the laser diode driving device illustrated in FIG. 6.
Figure 8:
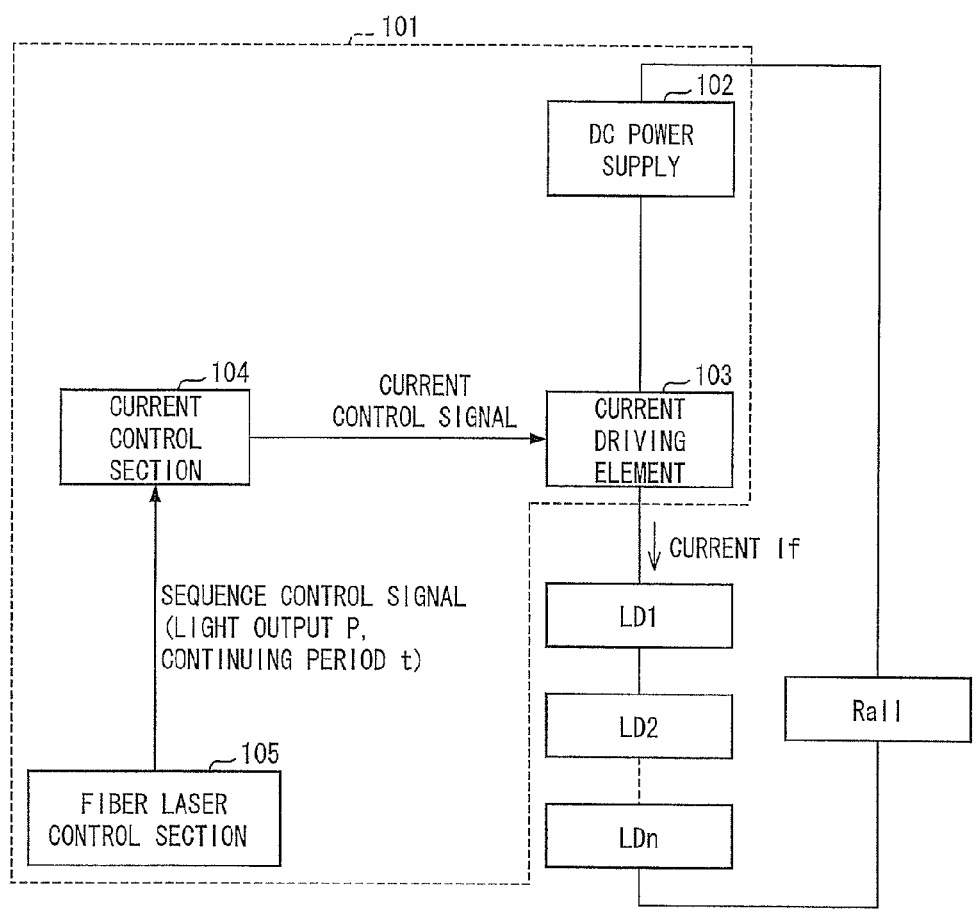
FIG. 8 is a block diagram schematically illustrating a configuration of a conventional laser diode driving device.
Figure 9:
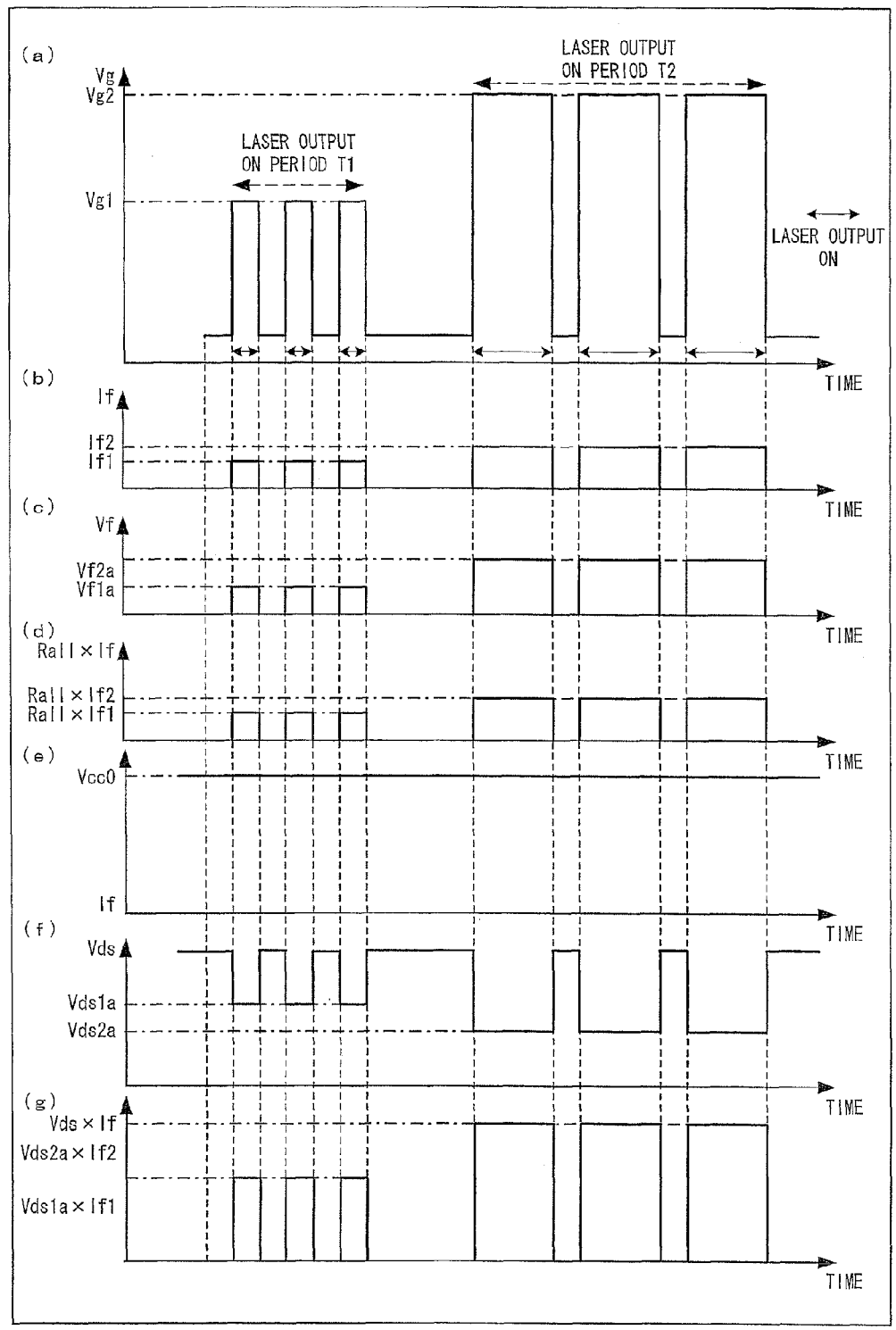
FIG. 9 is a diagram illustrating respective waveforms of, for example, (i) a voltage control signal from a current control section of the laser diode driving device illustrated in FIG. 8 and (ii) a current If that flows through laser diodes.

The following describes, with reference to FIG. 7, an operation of the laser diode driving device 1' for the case in which the laser diodes LD1 to LDn output a light output P1 during an ON period T1.

FIG. 7 is a flowchart illustrating a sequence of the operation of the laser diode driving device 1'. First, the fiber laser control section 6 supplies, on the basis of a preset sequence program, the current control section 5 with a sequence control signal indicative of (i) a light output P1 to be outputted by the laser diodes LD1 to LDn and (ii) an output continuing period t (S31). Then, the current control section 5 (i) accesses the memory section 8 to refer to the If-P characteristic data D1 and (ii) calculates, from the light output P1, a current If1 that is to flow through the laser diodes LD1 to LDn (S32). The current control section 5 thus determines a voltage value for a current control signal to be supplied to the current driving element 4 (S33), and supplies the value of the calculated current If1 to the power supply control section 7 (S34). The current control section 5 does not output a current control signal at this stage.

Next, the temperature sensor 9 measures the temperature of the laser diodes LD1 to LDn and supplies temperature information to the power supply control section 7 (S35). The power supply control section 7 then accesses the memory section 8 to refer to the If-Vf characteristic data D2, the voltage drop characteristic data D3, and the temperature characteristic data D5, and calculates (i) a forward voltage Vf1$a'$ of the laser diodes LD1 to LDn and (ii) a voltage drop If1×Rall at the resistance Rall, both for the case in which the current If1 is to flow at the temperature indicated by the temperature information (S36). More specifically, the power supply control section 7 refers to (i) the If-Vf characteristic data D2 to calculate a forward voltage Vf1$a$ of the laser diodes LD1 to LDn for the case in which the current If1 is to flow at a predetermined temperature and (ii) the temperature characteristic data D5 to correct the forward voltage Vf1$a$. The forward voltage Vf1$a'$ is expressed as $$Vf1a' = Vf1a + \alpha \times (T1a - T1b) \times n \quad (3)$$

where T1$a$ represents the predetermined temperature, and T1$b$ represents the temperature indicated by the temperature information.

Then, the power supply control section 7 (i) refers to the Vds setting data D4, (ii) calculates the sum of a voltage Vdsmin indicated by the Vds setting data D4, the forward voltage Vf1$a'$, and the voltage drop If1×Rall, and (iii) sets the calculated sum as an output voltage Vcc1' of the variable DC power supply 3 (S37). The power supply control section 7 supplies a voltage control signal to the variable DC power supply 3 so that the output voltage of the variable DC power supply 3 is set to Vcc1' (S38). After the output voltage of the variable DC power supply 3 has been set to Vcc1', the current control section 5 supplies the current driving element 4 with a current control signal having the voltage value determined in S33 (S39). This causes the current If1 to flow through the laser diodes LD1 to LDn.

Next, after a predetermined time period has elapsed (YES in S40), the temperature sensor 9 (i) measures the temperature of the laser diodes LD1 to LDn again and (ii) supplies temperature information indicative of the thus measured temperature to the power supply control section 7 (S41). In the case where the temperature T1$c$ measured in S41 is different from the immediately previously measured temperature T1$b$ (YES in S42), the power supply control section 7 refers to the If-Vf characteristic data D2 and the temperature characteristic data D5 to calculate again a forward voltage Vf1$a''$ of the laser diodes LD1 to LDn on the basis of Formula (3) (S43). The forward voltage Vf1$a''$ is expressed as follows:

$$Vf1a'' = Vf1a + \alpha \times (T1a - T1c) \times n$$

Then, the power supply control section 7 (i) refers to the Vds setting data D4, (ii) calculates the sum of the voltage Vdsmin indicated by the Vds setting data D4, the forward voltage Vf1$a''$, and the voltage drop If1×Rall (S44), and (iii) supplies a voltage control signal to the variable DC power supply 3 so that the variable DC power supply 3 has an output voltage Vcc1'' equal to the above sum (S45).

The present embodiment is, as described above, arranged to be able to change the output voltage of the variable DC power supply 3 in correspondence with a change in the temperature of the laser diodes LD1 to LDn. The forward voltages Vf1$a'$ and Vf1$a''$ calculated from Formulae (1) and (2), respectively, each have a value that has been corrected on the basis of the temperature of the laser diodes LD1 to LDn that has been measured by the temperature sensor 9. The forward voltages Vf1$a'$ and Vf1$a''$ are thus each equal to the actual forward voltage of the laser diodes LD1 to LDn. Consequently, the present embodiment allows the inter-terminal voltage Vds of the current driving element 4 to be constant at Vdsmin more accurately than with the laser diode driving device 1 of the first embodiment above regardless of a change in the temperature of the laser diodes LD1 to LDn.

The cycle from S40 to S45 is repeated until the light output of the sequence control signal is switched. In the case where the light output of the sequence control signal has been switched, the output voltage of the variable DC power supply 3 is, through steps similar to the steps S32 to S38, set again on the basis of the light output as switched.

A change in the temperature of the laser diodes LD1 to LDn is largest immediately after the laser diodes LD1 to LDn are driven, and then becomes milder over time. The present embodiment may thus be arranged such that the temperature sensor 9 measures temperature at an interval (corresponding to the predetermined time period in S40) that is (i) set to be shortest immediately after the laser diodes LD1 to LDn are driven or the light output is switched and (ii) set to become gradually longer over time.

(Supplemental Notes)

The embodiments above each deal with an arrangement in which the current driving element has a constant inter-terminal voltage regardless of the amount of a current through the laser diodes. The inter-terminal voltage of the current driving element is, however, not necessarily constant. Specifically, the embodiments above may each be arranged such that in the case where the current control section switches amounts of the current, the power supply control section changes the output voltage Vcc in such a manner that the difference between (i) an inter-terminal voltage Vds1$b$ during the ON period T1, in which the current If1 before the switch flows, and (ii) an inter-terminal voltage Vds2$b$ during the ON period T2, in which the current If2 after the switch flows, is smaller than the same difference for the case in which the output voltage Vcc is constant throughout the ON period T1 and the ON period T2. This arrangement can reduce the risk of the current driving element breaking down due to a temperature rise or becoming unable to control the amount of a current that is to flow through the laser diodes.

The embodiments above each use an N-channel type MOS transistor as the current driving element. The embodiments above are, however, not limited to such an arrangement, and may use, for example, a P-channel type MOS transistor or bipolar transistor as the current driving element. In the case where the current driving element is a MOS transistor, the minimum inter-terminal voltage that allows the current control section to control the amount of the current refers to a minimum voltage across the drain and the source which voltage allows the current driving element to operate in a saturation region. In the case where the current driving element is a bipolar transistor, the minimum inter-terminal voltage that allows the current control section to control the amount of the current refers to a minimum voltage across the collector and the emitter which voltage allows the current driving element to operate in an active region.

The embodiments above are each arranged such that the inter-terminal voltage of the current driving element is, regardless of the light output of the laser diodes, set to a minimum voltage value that allows the current driving element to control the current that is to flow through the laser diodes. The embodiments above are, however, not limited to such an arrangement. The inter-terminal voltage of the current driving element can be set to any voltage value as long as it (i) allows the current driving element to control the current that is to flow through the laser diodes and (ii) does not cause the current driving element to break down due to a temperature rise. In the case where, for instance, the inter-terminal voltage of the current driving element is set to a relatively high value, the current that is to flow through the laser diodes can have a reduced rise period.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

The light source driving device according to the embodiment of the present invention may preferably be arranged such that the power supply control section, regardless of the amount of the current, controls the output voltage so that the voltage across the controlled terminals is constant.

With the above arrangement, the current that the current driving element causes to flow can rise at constant timing regardless of the amount of the current that is to flow through the semiconductor light source. The above arrangement thus allows the output of the semiconductor light source to rise more rapidly.

The light source driving device according to the embodiment of the present invention may preferably be arranged such that the voltage across the controlled terminals is a minimum voltage that allows the current control section to control the amount of the current.

The above arrangement can reduce power consumption and temperature rise of the current driving element to a minimum.

The light source driving device according to the embodiment of the present invention may preferably further include: a temperature sensor for detecting a temperature of the semiconductor light source, wherein: the storage section further stores temperature characteristic data indicative of a temperature characteristic of the forward voltage of the semiconductor light source; and the power supply control section controls the output voltage on a basis of the current-voltage characteristic data, the voltage drop characteristic data, and the temperature characteristic data.

The forward voltage of the semiconductor light source is temperature-dependent. Thus, a change in temperature of the semiconductor light source over time changes the voltage across the controlled terminals of the current driving element. In view of this, the above arrangement causes the power supply control section to, in consideration of the temperature dependence of the forward voltage, control the output voltage of the variable power supply so that the voltage across the controlled terminals of the current driving element is constant. The above arrangement thus allows the voltage across the controlled terminals to be constant more accurately regardless of a change in temperature of the semiconductor light source.

The light source driving device according to the embodiment of the present invention may preferably be arranged such that the storage section further stores voltage setting data indicative of a setting value for the voltage across the controlled terminals; and the power supply control section (i) calculates, on a basis of the current-voltage characteristic data, the forward voltage of the semiconductor light source with respect to the amount of the current that the current driving element causes to flow, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

According to the above arrangement, the power supply control section (i) calculates, on the basis of current-voltage characteristic data and voltage drop characteristic data, the forward voltage and voltage drop, respectively, with respect to the current that the current driving element causes to flow, and (ii) sets, as the value of the output voltage, the sum of the value of the calculated forward voltage, the value of the calculated voltage drop, and the setting value indicated by the voltage setting data. In a circuit constituted by a variable power supply, a semiconductor light source, and a current driving element, the sum of (i) the value of the forward voltage of the semiconductor light source, (ii) the value of the voltage drop at the resistance, and (iii) the value of the voltage across the controlled terminals of the current driving element is equal to the output voltage of the variable power supply. The voltage across the controlled terminals of the current driving element is thus equal to the setting value indicated by the voltage setting data. The above arrangement consequently allows the voltage across the controlled terminals of the current driving element to be constant at the setting value regardless of the amount of the current that is to flow through the semiconductor light source.

The light source driving device according to the embodiment of the present invention may preferably be arranged such that the storage section further stores voltage setting data indicative of a setting value for the voltage across the controlled terminals; and the power supply control section (i) calculates, on a basis of the current-voltage characteristic data and the temperature characteristic data, the forward voltage of the semiconductor light source with respect to (a) the amount of the current that the current driving element causes to flow and (b) the temperature detected by the temperature sensor, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

According to the above arrangement, the power supply control section calculates the forward voltage of the semiconductor light source on the basis of the current-voltage characteristic data and the temperature characteristic data. The above arrangement can thus calculate the forward voltage more accurately regardless of a change in temperature of the semiconductor light source. The above arrangement consequently allows the voltage across the controlled terminals of the current driving element to be constant at the setting value regardless of (i) the amount of the current that is to flow through the semiconductor light source or (ii) a change in temperature of the semiconductor light source.

A fiber laser device according to the embodiment of the present invention includes: an amplification fiber; an excitation light source for exciting the amplification fiber; and a light source driving device for driving the excitation light source, the light source driving device being the light source driving device having any of the above arrangements. This makes it possible to provide a fiber laser device that is capable of causing laser light output of an amplification fiber to constantly rise rapidly with use of a simple arrangement.

INDUSTRIAL APPLICABILITY

The present invention is applicable to a light source driving device for driving any semiconductor light source including not only a laser diode but also a light-emitting diode, for example.

REFERENCE SIGNS LIST 1 laser diode driving device
1' laser diode driving device
2 amplification fiber
3 variable DC power supply (variable power supply)
4 current driving element
5 current control section
6 fiber laser control section
7 power supply control section
8 memory section
9 temperature sensor
10 fiber laser device
11 MO section
12 PA section
D1 If-P characteristic data
D2 If-Vf characteristic data (current-voltage characteristic data)
D3 voltage drop characteristic data
D4 Vds setting data (voltage setting data)
D5 temperature characteristic data
If current
LD1 to LDn laser diode (semiconductor light source)
Rall resistance
T1 ON period (first period)
T2 ON period (second period)
Toff OFF period
Vcc output voltage
Vds inter-terminal voltage (voltage across controlled terminals)
Vdsmin voltage value (setting value)
Vf forward voltage

The invention claimed is:
1. A fiber laser device comprising:
an amplification fiber;
an excitation light source for exciting the amplification fiber; and
a light source driving device for driving the excitation light source,
the light source driving device including:
a variable power supply for outputting a voltage for driving a semiconductor light source;
a current driving element for causing a current to flow through the semiconductor light source, the current driving element being connected to the semiconductor light source in series;
a current control section for controlling (i) turning on and off of the current driving element and (ii) an amount of the current; and
a power supply control section for controlling the voltage outputted by the variable power supply,
the light source driving device further comprising:
a storage section storing (i) current-voltage characteristic data indicative of a characteristic of a forward voltage of the semiconductor light source with respect to the current and (ii) voltage drop characteristic data indicative of a characteristic of a voltage drop at a resistance with respect to the current, the resistance being of a component of a circuit constituted by the variable power supply, the semiconductor light source, and the current driving element, the component being a component other than the semiconductor light source and the current driving element,
the current control section, in a case of switching amounts of the current, causing the current driving element to be off during an intermediate period between (i) a first period during which the current before the switch flows and (ii) a second period during which the current after the switch flows,
the power supply control section changing the output voltage during the intermediate period on a basis of the current-voltage characteristic data and the voltage drop characteristic data so that a difference between (i) a voltage across controlled terminals of the current driving element during the first period and (ii) the voltage across the controlled terminals of the current driving element during the second period has a value smaller than a value of the difference for a case in which the output voltage is constant throughout the first period and the second period.

2. The fiber laser device according to claim 1,
wherein:
the power supply control section, regardless of the amount of the current, controls the output voltage so that the voltage across the controlled terminals is constant.

3. The fiber laser device according to claim 2,
wherein:
the voltage across the controlled terminals is a minimum voltage that allows the current control section to control the amount of the current.

4. The fiber laser device according to claim 3,
wherein:
the light source driving device further includes a temperature sensor for detecting a temperature of the semiconductor light source;
the storage section further stores temperature characteristic data indicative of a temperature characteristic of the forward voltage of the semiconductor light source; and
the power supply control section controls the output voltage on a basis of the current-voltage characteristic data, the voltage drop characteristic data, and the temperature characteristic data.

5. The fiber laser device according to claim 4,
wherein:
the storage section further stores voltage setting data indicative of a setting value for the voltage across the controlled terminals; and
the power supply control section (i) calculates, on a basis of the current-voltage characteristic data and the temperature characteristic data, the forward voltage of the semiconductor light source with respect to (a) the amount of the current that the current driving element causes to flow and (b) the temperature detected by the temperature sensor, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

6. The fiber laser device according to claim 3, wherein:
the storage section further stores voltage setting data indicative of a setting value for the voltage across the controlled terminals; and
the power supply control section (i) calculates, on a basis of the current-voltage characteristic data, the forward voltage of the semiconductor light source with respect to the amount of the current that the current driving element causes to flow, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

7. The fiber laser device according to claim 2, wherein:
the light source driving device further includes a temperature sensor for detecting a temperature of the semiconductor light source;
the storage section further stores temperature characteristic data indicative of a temperature characteristic of the forward voltage of the semiconductor light source; and
the power supply control section controls the output voltage on a basis of the current-voltage characteristic data, the voltage drop characteristic data, and the temperature characteristic data.

8. The fiber laser device according to claim 7, wherein:
the storage section further stores voltage setting data indicative of a setting value for the voltage across the controlled terminals; and
the power supply control section (i) calculates, on a basis of the current-voltage characteristic data and the temperature characteristic data, the forward voltage of the semiconductor light source with respect to (a) the amount of the current that the current driving element causes to flow and (b) the temperature detected by the temperature sensor, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

9. The fiber laser device according to claim 2, wherein:
the storage section further stores voltage setting data indicative of a setting value for the voltage across the controlled terminals; and
the power supply control section (i) calculates, on a basis of the current-voltage characteristic data, the forward voltage of the semiconductor light source with respect to the amount of the current that the current driving element causes to flow, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

10. The fiber laser device according to claim 1, wherein:
the light source driving device further includes a temperature sensor for detecting a temperature of the semiconductor light source;
the storage section further stores temperature characteristic data indicative of a temperature characteristic of the forward voltage of the semiconductor light source; and
the power supply control section controls the output voltage on a basis of the current-voltage characteristic data, the voltage drop characteristic data, and the temperature characteristic data.

11. The fiber laser device according to claim 10, wherein:
the storage section further stores voltage setting data indicative of a setting value for the voltage across the controlled terminals; and
the power supply control section (i) calculates, on a basis of the current-voltage characteristic data and the temperature characteristic data, the forward voltage of the semiconductor light source with respect to (a) the amount of the current that the current driving element causes to flow and (b) the temperature detected by the temperature sensor, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

12. The fiber laser device according to claim 1, wherein:
the storage section further stores voltage setting data indicative of a setting value for the voltage across the controlled terminals; and
the power supply control section (i) calculates, on a basis of the current-voltage characteristic data, the forward voltage of the semiconductor light source with respect to the amount of the current that the current driving element causes to flow, (ii) calculates, on a basis of the voltage drop characteristic data, the voltage drop at the resistance with respect to the amount of the current that the current driving element causes to flow, and (iii) controls the output voltage so that a sum of a value of the calculated forward voltage, a value of the calculated voltage drop, and the setting value equals a value of the output voltage.

* * * * *